(12) United States Patent
Lin et al.

(10) Patent No.: US 8,792,078 B2
(45) Date of Patent: Jul. 29, 2014

(54) METHOD AND PELLICLE MOUNTING APPARATUS FOR REDUCING PELLICLE INDUCED DISTORTION

(75) Inventors: Cheng-Ming Lin, Siluo Township (TW);
Chien-Chao Huang, Hsinchu (TW);
Jong-Yuh Chang, Jhubei (TW);
Chia-Wei Chang, Taipei (TW); Boming Hsu, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 1090 days.

(21) Appl. No.: 12/767,152

(22) Filed: Apr. 26, 2010

(65) Prior Publication Data

US 2010/0271612 A1 Oct. 28, 2010

Related U.S. Application Data

(60) Provisional application No. 61/173,008, filed on Apr. 27, 2009.

(51) Int. Cl.
*G03B 27/42* (2006.01)

(52) U.S. Cl.
USPC ............. 355/53; 355/63; 355/67; 355/77

(58) Field of Classification Search
CPC ....... G03B 27/58; G03F 1/62; G03F 7/70833; G03F 7/70825; G03F 1/64; H01L 21/683
USPC ............ 355/53, 63, 67, 75, 76, 77, 72; 156/379.8, 345.1; 430/5
See application file for complete search history.

(56) References Cited

U.S. PATENT DOCUMENTS 6,619,359 B2 * 9/2003 Ballard et al. ............. 156/366

* cited by examiner

*Primary Examiner* — Steven H Whitesell Gordon
*Assistant Examiner* — Mesfin T Asfaw
(74) *Attorney, Agent, or Firm* — Lowe Hauptman & Ham, LLP

(57) ABSTRACT

An apparatus for mounting a pellicle onto a mask is provided. In one embodiment, the apparatus comprises a base provided with a track; a dummy plate holder coupled to the base, the dummy plate holder for receiving a dummy plate having an elevated portion on one side thereof; a mask holder for receiving a mask, the mask holder slidably coupled to the base; a pellicle holder for receiving a pellicle frame, the pellicle holder slidably coupled to the base; and drive means being adapted to drive the pellicle holder along the track towards the dummy plate holder, wherein during operation when the pellicle frame is mounted onto the mask causing the mask to contact the dummy plate, the mounting pressure in the mask is distributed by way of the elevated portion in the dummy plate, thus reducing distortion in the mask.

20 Claims, 4 Drawing Sheets

METHOD AND PELLICLE MOUNTING APPARATUS FOR REDUCING PELLICLE INDUCED DISTORTION

CROSS-REFERENCE TO RELATED APPLICATIONS

The present application claims priority of U.S. Provisional Patent Application Ser. No. 61/173,008, filed on Apr. 27, 2009, which is incorporated herein by reference in its entirety.

BACKGROUND

The present disclosure relates generally to the field of lithography, and more particularly, to a method and apparatus for reducing distortion to a mask during a pellicle to mask mounting process.

Optical projection lithography is a process by which an image on a mask is transferred to a substrate. A mask is typically included with a frame and a pellicle, collectively referred to as a mask system. The frame holds the mask and the pellicle in a transparent thin film that is mounted over the frame. The pellicle protects the mask from fallen particles and keeps the particles out of focus so that they do not produce an image, which may cause defects when the mask is being used. The pellicle is typically stretched and mounted over the frame and is attached to the frame by glue or other adhesive. The pellicle has become an indispensable component in optical projection lithography because of its defect prevention properties.

Existing pellicle application techniques use pressure to create an adhesive bond between the pellicle frame and the mask. During mounting, a pressure is applied to the pellicle in order to create a seal between the pellicle and the mask. The pressure distorts both the pellicle frame and the mask causing the flatness of the mask to degrade and cause registration errors on the wafer. Recently, experiments show that the stress due to pellicle mounting can contribute between 10 and 32 nm of inconsistent lateral pattern positioning at the mask. After a 4× reduction, the overlay accuracy has a pellicle-mounting component in the range of 2.5~8 nm, which is undesirable. Therefore, what is needed is an apparatus and method to reduce pellicle induced distortion to the mask and overlay error.

BRIEF DESCRIPTION OF THE DRAWINGS

The features, aspects, and advantages of the present disclosure will become more fully apparent from the following detailed description, and accompanying drawings in which.

DETAILED DESCRIPTION

In the following description, numerous specific details are set forth to provide a thorough understanding of the present disclosure. However, one having an ordinary skill in the art will recognize that embodiments of the disclosure can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
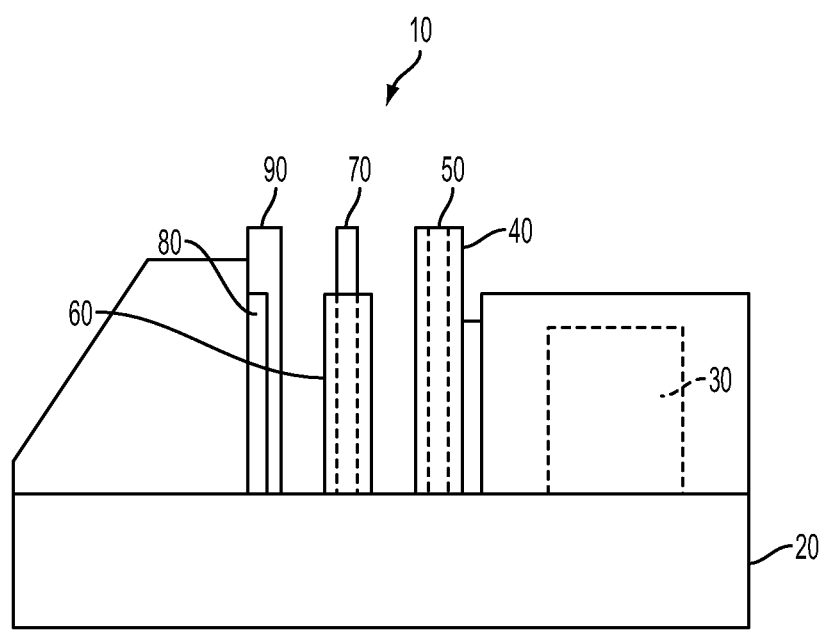
FIG. 1 is a cross-sectional view of a pellicle mounting apparatus for coupling a pellicle to a mask according to one embodiment of the present disclosure.

FIG. 1 is a cross-sectional view of a pellicle mounting apparatus 10 for mounting a pellicle frame 50 onto a mask 70 according to one embodiment of the present disclosure. A pellicle mounting apparatus, such as the Micro Lithography, Inc. Pellicle Mounting Machine (Model No. 8001), may be used to mount a pellicle onto a mask. It is understood by those skilled in the art that the present disclosure may be practiced with other pellicle mounting machines as well. Pellicle mounting apparatus 10 may include a base unit, a control unit, and an exhaust unit. The base unit may include a base 20 provided with one or more guide rails (not shown), control/display panel (not shown), a drive mechanism 30, a pellicle holder 40, a mask holder 60, and a dummy plate holder 80. The base unit may further include other features such as, for example a safety curtain, a mounting force meter, operation indicators, one or more sensors that detect the appearance of the pellicle frame as it is moving towards the mask, and an air inlet and a regulator all of which is understood by those skilled in the art.

Figure 2:
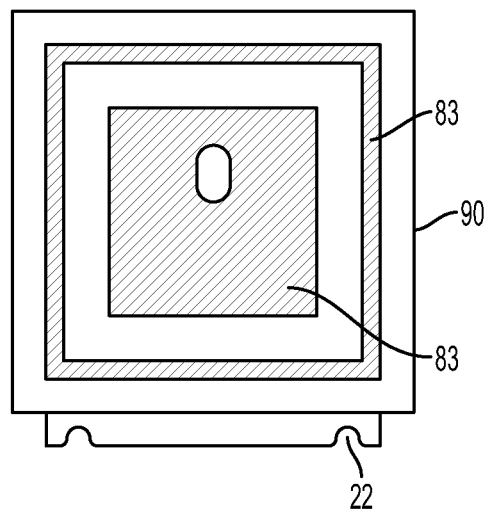
FIG. 2 is a view of a dummy plate according to a first embodiment of the present disclosure.

The dummy plate holder 80 is coupled to base 20 and is operable to receive a dummy plate 90. In one embodiment, the dummy plate holder 80 is rigidly mounted to the base 20. In another embodiment, the dummy plate holder 80 is slidably coupled to the base 20. One aspect of the present disclosure that will be described in greater detail below is that the dummy plate has an elevated portion 83 (as shown in FIG. 2) on one side thereof for reducing or eliminating distortion to the mask during a mounting process. Mask holder 60 is slidably coupled to base 20 and operates to receive a mask 70. Mask holder 60 may accommodate a variety of mask types, including, but not limited to, a five inch mask, a six inch mask, a nine inch mask or any other appropriately sized mask that may be used to project an image of a circuit pattern onto a semiconductor wafer. Pellicle holder 40 is slidably coupled to base 20 and operates to receive a pellicle frame 50 that includes the pellicle film. The pellicle holder 40 may accommodate a variety of pellicle frame sizes.

The drive mechanism 30 operates to move pellicle holder 40 along the guide rail(s) towards the dummy plate holder 80. Drive mechanism 30 may include an electric motor, pneumatic press, a hydraulic press, or a mechanical drive shaft. An operator may press a button, turn a knob or use any other suitable technique to mechanically or electrically close a trigger switch on the control unit that activates the drive mechanism 30 of the pellicle mounting apparatus 10. In one embodiment, the drive mechanism 30 may be activated when the operator throws a switch directing voltage to a solenoid that allows air into a pneumatic or hydraulic press. In another embodiment, the drive mechanism 30 may be activated when the operator engages a motor in order to operate the mechanical drive shaft.

The control unit of the pellicle mounting apparatus 10 controls the operation of the base unit. The control unit may include a man-machine interface (MMI), a motor drive, a PLC (programmable logic controller), a safety curtain controller and control switches as well as a power indicator. The control unit may have an LCD (liquid crystal) display on the front panel that displays information such as moving speed, holding time, operator prompts for action, etc.

The exhaust unit of the pellicle mounting apparatus 10 removes air from the base unit at the mounting area. The exhaust unit functions to remove particles thus improving photomask cleanliness.

In operation, an operator loads a mask 70 into the mask holder 60, a pellicle frame 50 into the pellicle holder 40 and a dummy plate 90 into the dummy plate holder 80. It is understood by those skilled in the art that the correct dummy plate 90 is used for the appropriately sized mask 70. For example, a 6" dummy plate is to be used for a 6" mask, a 7" dummy plate for a 7" mask and so on. As shown in FIGS. 2-6 the dummy plate 90 may contain two or more grooves 22 for proper seating and support in the base unit. The operator turns on the pellicle mounting apparatus 10 and selects the proper parameter settings, such as for example the moving speed and the mounting force. After triggering a start switch on the base unit or remotely, the drive mechanism 30 then applies force to move the pellicle holder 40 along guide rail(s) towards dummy plate holder 80 and as a result, the pellicle frame 50 is brought into contact with the mask 70. In some embodiments, the pellicle frame 50 includes an adhesive along the periphery of one side thereof for securely mounting the pellicle frame 50 to the mask 70.

One aspect of the present disclosure is that the dummy plate 90 has an elevated portion 83 on one side facing the mask 70. The elevated portion 83 acts as a stress-absorbing feature between the pellicle frame 50 and the mask 70. The elevated portion 83 is designed and configured to be capable of distributing the mounting pressure in the mask 70 and releasing stress on the mask 70 caused by the mounting of the pellicle to the mask 70. Therefore, the stress caused during the mounting process can be reduced or eliminated from being transferred to the mask 70 and flatness of the mask can be preserved. This can in turn eliminate or reduce the overlay error when such mask-pellicle system is used in a lithography patterning process.

Figure 3:
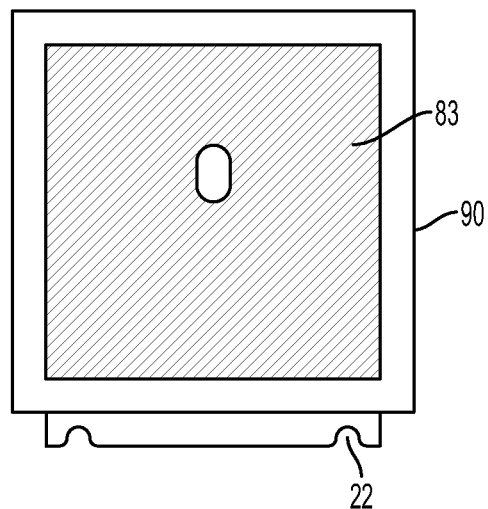
FIG. 3 is a view of a dummy plate according to a second embodiment of the present disclosure.
Figure 4:
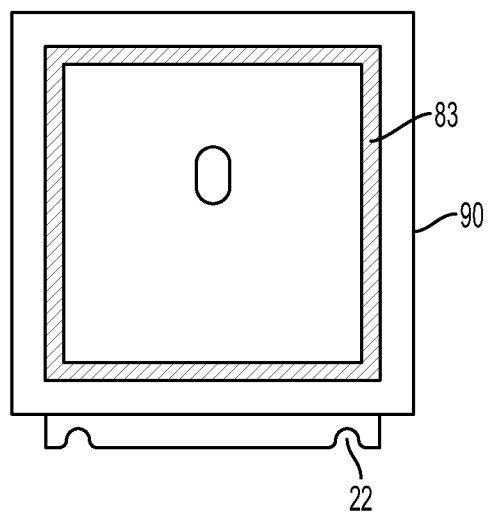
FIG. 4 is a view of a dummy plate according to a third embodiment of the present disclosure.
Figure 5:
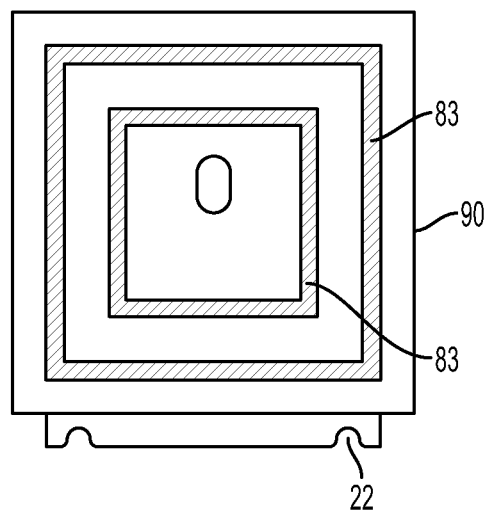
FIG. 5 is a view of a dummy plate according to a fourth embodiment of the present disclosure.
Figure 6:
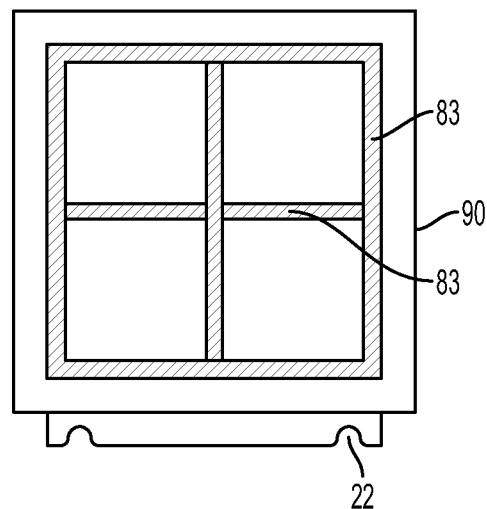
FIG. 6 is a view of a dummy plate according to a fifth embodiment of the present disclosure.

The elevated portion 83 of the dummy plate may be designed in various dimensions, shapes and configurations as shown in FIGS. 2-6. In one embodiment, as shown in FIG. 2 dummy plate 90 includes a centrally elevated portion 83 surrounded by an outer elevated portion 83. FIG. 3 shows a plan-type dummy plate 90 where the elevated portion 83 is in the central part thereof, according to another embodiment of the present disclosure. FIG. 4 shows a ring type dummy plate 90 where the elevated portion 83 is located at the periphery of the dummy plate, according to yet another embodiment of the present disclosure. FIG. 5 shows a double ring type dummy plate 90 having two ring shaped elevated portions 83, one inside the other, according to yet another embodiment of the present disclosure. FIG. 6 shows a cross type dummy plate 90 having elevated portions 83 in a cross-type formation, according to yet another embodiment of the present disclosure.

In various embodiments, the elevated portion 83 may include a polymer material, a rubber compound, a sponge-like material, a foam material, a silicone material, or a combination thereof. In still other embodiments, the elevated portion 83 may include an accordion-type material capable of releasing the stress of the mask during a pellicle to mask mounting process. The accordion-type material may alternatively or collectively utilize other materials or mechanisms to release the stress to the mask thus maintaining mask flatness. In still other embodiments, the dummy plate may use any other proper material that is capable of releasing stress.

In the preceding detailed description, the present disclosure is described with reference to specifically exemplary embodiments thereof. It will be evident that the shapes and materials of the dummy plate used in an apparatus for mounting a pellicle to a mask are not limited to those described in the above-mentioned embodiments, and other desired shapes and materials may be used without departing from the broader spirit and scope of the present invention, as set forth in the claims The specification and drawings are, accordingly, to be regarded as illustrative and not restrictive.

What is claimed is:

1. An apparatus for mounting a pellicle onto a mask, the apparatus comprising:
    a base provided with a track;
    a dummy plate holder coupled to the base, the dummy plate holder configured to receive and hold a dummy plate in an operating position, the dummy plate having an elevated portion on one side thereof, the elevated portion comprising a shock absorbing material that comprises one or more of a sponge material, a rubber-compound, a foam material, or an accordion material;
    a mask holder for receiving a mask having a central portion and a periphery outside the central portion, the mask holder slidably coupled to the base;
    a pellicle holder for receiving a pellicle frame, the pellicle holder slidably coupled to the base; and
    a drive means, the drive means being adapted to drive the pellicle holder along the track towards the dummy plate holder, wherein the elevated portion in the dummy plate is adapted to align with the central portion of the mask and distribute the mounting pressure in the mask when the pellicle frame is mounted onto the mask, thereby reducing distortion in the mask.

2. The apparatus of claim 1, wherein the dummy plate holder is rigidly coupled to the base.

3. The apparatus of claim 1, wherein the dummy plate holder is slidably coupled to the base.

4. The apparatus of claim 1, wherein the dummy plate has a ring-type shaped elevated portion.

5. The apparatus of claim 1, wherein the dummy plate has a double-ring type shaped elevated portion.

6. The apparatus of claim 1, wherein the dummy plate has a plan-type shaped elevated portion.

7. The apparatus of claim 1, wherein the dummy plate has a cross-type shaped elevated portion.

8. The apparatus of claim 1, wherein the pellicle frame includes an adhesive along the periphery of one side thereof.

9. The apparatus of claim 1, wherein the drive means comprises an electric motor, pneumatic press, a hydraulic press, or a mechanical drive shaft.

10. The apparatus of claim 1, wherein the dummy plate comprises at least two grooves for seating and support in the base.

11. A dummy plate for use in an apparatus for mounting a pellicle onto a mask having a central portion and a periphery outside the central portion, the dummy plate having an elevated portion on one side thereof, the elevated portion comprising a shock absorbing material that comprises one or more of a sponge material, a rubber-compound, a foam material, or an accordion material, wherein the elevated portion is configured to align with the central portion of the mask.

12. The dummy plate of claim 11, wherein the elevated portion has a ring-type shape.

13. The dummy plate of claim 11, wherein the elevated portion has a double-ring type shape.

14. The dummy plate of claim 11, wherein the elevated portion has a plan-type shape.

15. The dummy plate of claim 11, wherein the elevated portion has a cross-type shape.

16. A method for mounting a pellicle onto a mask, comprising:

removably placing a dummy plate having an elevated portion on one side thereof into a dummy plate holder, the elevated portion comprising a shock absorbing material that comprises one or more of a sponge material, a rubber-compound, a foam material, or an accordion material;

placing a mask having a central portion and a periphery outside the central portion into a mask holder;

placing a pellicle frame into a pellicle holder; and driving the pellicle holder towards the dummy plate holder, whereby when the pellicle frame couples the mask causing the mask to contact the dummy plate in a manner by which the elevated portion aligns with the central portion of the mask, and the mounting pressure in the mask is distributed by way of the elevated portion in the dummy plate, thereby reducing distortion in the mask.

17. The method of claim 16, wherein the dummy plate has a ring-type shaped elevated portion.

18. The method of claim 16, wherein the dummy plate has a double-ring type shaped elevated portion.

19. The method of claim 16, wherein the dummy plate has a plan-type shaped elevated portion.

20. The method of claim 16, wherein the dummy plate has a cross-type shaped elevated portion.

\* \* \* \* \*